(12) United States Patent
Eren et al.

(10) Patent No.: US 10,063,057 B2
(45) Date of Patent: Aug. 28, 2018

(54) DYNAMIC MAXIMUM EFFICIENCY TRACKER FOR PV MICRO-INVERTER

(71) Applicants: Suzan Eren, Kingston (CA); Majid Pahlevaninezhad, Kingston (CA); Shangzhi Pan, Kingston (CA); Praveen Jain, Kingston (CA)

(72) Inventors: Suzan Eren, Kingston (CA); Majid Pahlevaninezhad, Kingston (CA); Shangzhi Pan, Kingston (CA); Praveen Jain, Kingston (CA)

(73) Assignee: SPARQ SYSTEMS INC., Kingston, Ontario (CA)

( * ) Notice: Subject to any disclaimer, the term of this patent is extended or adjusted under 35 U.S.C. 154(b) by 0 days.

(21) Appl. No.: 14/921,629

(22) Filed: Oct. 23, 2015

(65) Prior Publication Data

US 2017/0117822 A1    Apr. 27, 2017

(51) Int. Cl.
  *G05F 1/67* (2006.01)
  *H02J 3/38* (2006.01)
  *H01L 31/02* (2006.01)

(52) U.S. Cl.
  CPC ........ *H02J 3/385* (2013.01); *H01L 31/02021* (2013.01)

(58) Field of Classification Search
  CPC ......... G05F 1/67; H02M 7/53; H02M 7/5387; H02M 7/53871; H02M 2001/0025; Y02E 10/50; Y02E 10/56; Y02E 10/58
  See application file for complete search history.

(56) References Cited

U.S. PATENT DOCUMENTS

| | | | | |
|---|---|---|---|---|
| 6,111,767 A | * | 8/2000 | Handleman | G05F 1/67 136/293 |
| 6,339,538 B1 | * | 1/2002 | Handleman | G05F 1/67 136/293 |
| 9,680,370 B2 | * | 6/2017 | Han | H02M 3/04 |
| 2013/0027997 A1 | * | 1/2013 | Tan | G05F 1/67 363/95 |
| 2014/0321173 A1 | * | 10/2014 | Jones | H02J 3/383 363/40 |
| 2016/0254673 A1 | * | 9/2016 | Batten | G05F 1/67 |
| 2017/0028853 A1 | * | 2/2017 | Elshaer | B60L 11/182 |

* cited by examiner

*Primary Examiner* — Gary L Laxton
(74) *Attorney, Agent, or Firm* — Brion Raffoul

(57) ABSTRACT

Systems, methods, and devices relating to the control of power conditioning systems. For a micro-inverter, a controller block controls the DC/DC converter while a separate controller block controls the DC/AC inverter. A dynamic maximum efficiency tracker (DMET) control block receives state variable outputs from the converter and the inverter. The control block then perturbs specific control input parameters for the converter and the inverter and determines the effect of the perturbation on the converter and inverter efficiencies and on micro-inverter efficiency as a whole. If the efficiency decreases, then the direction of the perturbation is reversed. Other system control tasks, such as maximum power point tracking and DC-bus voltage regulation can be performed concurrently by adjusting other control input parameters.

7 Claims, 11 Drawing Sheets

US 10,063,057 B2

DYNAMIC MAXIMUM EFFICIENCY TRACKER FOR PV MICRO-INVERTER

TECHNICAL FIELD

The present invention relates to systems, methods, and devices relating to grid-connected converters for use in a power grid. More specifically, the present invention relates to methods and devices for controlling a grid connected converter in order to track the maximum efficiency point of the converter.

BACKGROUND

Renewable energy systems are becoming more prevalent due to their advantages over the conventional fossil-based power generation systems. By harvesting energy from renewable energy sources, the detrimental impact of the conventional fossil-based power generation systems can significantly be reduced. In order to bring renewable energy systems into mainstream power generation, the efficiency of the renewable energy system should be sufficiently high under different conditions. One of the challenges is the erratic nature of renewable energy systems. For instance, in the case of solar based power generation systems, solar irradiance varies randomly depending on the weather condition. Similarly, in the case of wind based power generation systems, the speed of the wind turbine can significantly fluctuate based on weather conditions. Preferably, power converters used to extract power from renewable energy sources should be able to efficiently extract power under a wide range of operating conditions.

Photovoltaic (PV) panels are commonly used to convert solar energy to electricity. These panels are connected to a solar power conditioning system which extracts the electricity and feeds it to the grid and/or to local loads. Micro-inverters are widely used as the power conditioning system for a PV panel. Micro-inverters have several advantages such as allowing for individual maximum power point tracking (MPPT) and eliminating partial shading problem. FIG. 1 shows a typical power conditioning system for a PV micro-inverter. According to FIG. 1, the micro-inverter power conditioning system includes two stages: a DC/DC converter and a DC/AC inverter. The DC/DC converter is responsible for boosting the voltage, tracking the maximum power point of the PV panel, and possibly providing galvanic isolation. The DC/AC inverter is responsible for injecting a high quality current to the utility grid. In addition to these components, there is also a control system that controls the DC/DC converter and the DC/AC inverter to thereby enable the PV micro-inverter to perform these tasks. As well as these components, there is also a communication system which interacts with the control system to monitor and interact with any externally controlled settings.

Referring to FIG. 2, illustrated is an exemplary detailed block diagram of a control system for a micro-inverter according to the prior art. As can be seen from FIG. 2, the DC/DC converter and the DC/AC inverter have independent controllers. The controller for the DC/DC converter determines the gate pulses for the DC/DC converter in order to track the maximum power point of the PV panel. The controller for the DC/AC inverter has two cascaded control loops. The external loop regulates the DC-bus voltage by adjusting the reference value of the output current in order to guarantee the power balance. The current loop controls the output current of the inverter to allow for the injection of a nearly sinusoidal current into the utility grid.

One of the main challenges in the micro-inverter is how to maintain a high efficiency for a very wide range of operating conditions. For example, the PV panel output voltage can vary significantly based on the temperature and the irradiance (e.g., for a typical currently produced 60-cell PV panel, the voltage can vary between 19V-50V). One of the difficulties for the control system is that of controlling the converter in order to achieve high efficiency despite the extremely high variations of the operating points.

Based on the above, there is therefore a need for systems and devices which mitigate if not avoid the shortcomings of the prior art.

SUMMARY

The present invention provides systems, methods, and devices relating to the control of power conditioning systems. For a micro-inverter, a controller block controls the DC/DC converter while a separate controller block controls the DC/AC inverter. A dynamic maximum efficiency tracker (DMET) control block receives state variable outputs from the converter and the inverter. The control block then perturbs specific control input parameters for the converter and the inverter and determines the effect of the perturbation on the converter and inverter efficiencies and on the micro-inverter efficiency as a whole. If the efficiency decreases, then the direction of the perturbation is reversed. Other system control tasks, such as maximum power point tracking and DC-bus voltage regulation can be performed concurrently by adjusting other control input parameters.

In a first aspect, the present invention provides a system for controlling at least one power conditioning module, the system comprising:
- a first controller block for controlling a converter circuit, said first controller block receiving input and output signals of said converter circuit;
- a second controller block for controlling an inverter circuit, said second controller block receiving input and output signals of said inverter circuit;
- a control block for determining an efficiency of said power conditioning module based on an input power and output power of said power conditioning module, said control module also being for adjusting at least one first control input to said first controller block and for adjusting at least one second control input to said second controller block;

wherein
- said inverter circuit is part of said power conditioning module;
- said converter circuit is part of said power conditioning module;
- said control module adjusts at least one of said first and second control inputs to thereby adjust said efficiency of said power conditioning module.

In a second aspect, the present invention provides a method for optimizing an operating point of a micro-inverter circuit, the method comprising:
a) receiving input state variables for at least part of said micro-inverter circuit;
b) receiving output state variables for at least part of said micro-inverter circuit;
c) determining an efficiency of said at least part of said micro-inverter circuit based on said input state variables and output state variables;
d) perturbing at least one control input to said at least part of said micro-inverter circuit to result in a perturbation of said at least one control input;

e) determining an effect on said efficiency by perturbation;

f) adjusting a direction of said perturbation based on said effect;

g) repeating steps d) to f) until a maximum efficiency for said at least part of said micro-inverter circuit.

In a third aspect, the present invention provides computer readable media having encoded thereon computer readable and computer executable code which, when executed, implements a method for optimizing an operating point of a micro-inverter circuit, the method comprising:

a) receiving input state variables for at least part of said micro-inverter circuit;

b) receiving output state variables for at least part of said micro-inverter circuit;

c) determining an efficiency of said at least part of said micro-inverter circuit based on said input state variables and output state variables;

d) perturbing at least one control input to said at least part of said micro-inverter circuit to result in a perturbation of said at least one control input;

e) determining an effect on said efficiency by perturbation;

f) adjusting a direction of said perturbation based on said effect;

g) repeating steps d) to f) until a maximum efficiency for said at least part of said micro-inverter circuit.

BRIEF DESCRIPTION OF THE DRAWINGS

The embodiments of the present invention will now be described by reference to the following figures, in which identical reference numerals in different figures indicate identical elements and in which.

DETAILED DESCRIPTION

Figure 1:
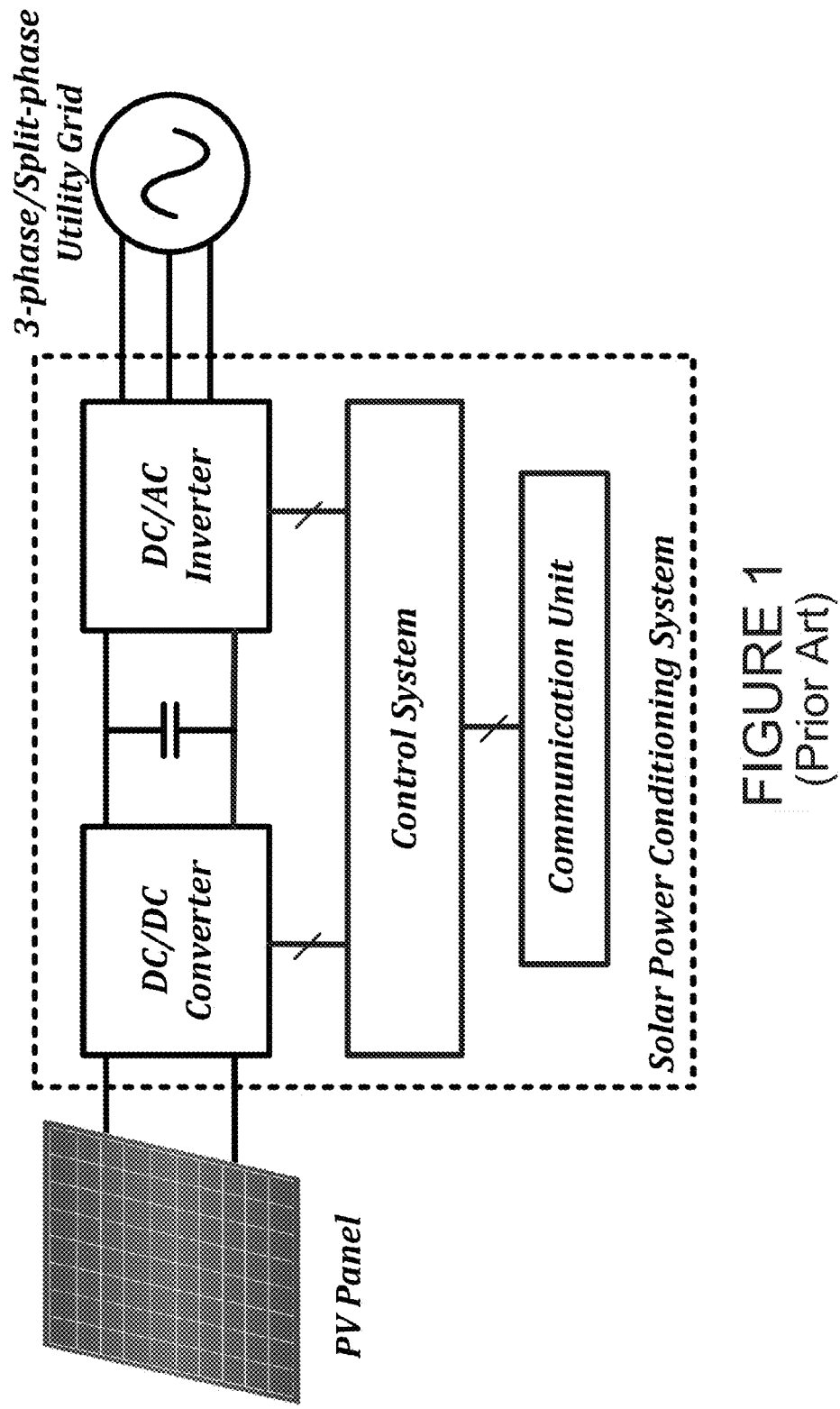
FIG. 1 is a block diagram of a solar power conditioning system according to the prior art.
Figure 2:
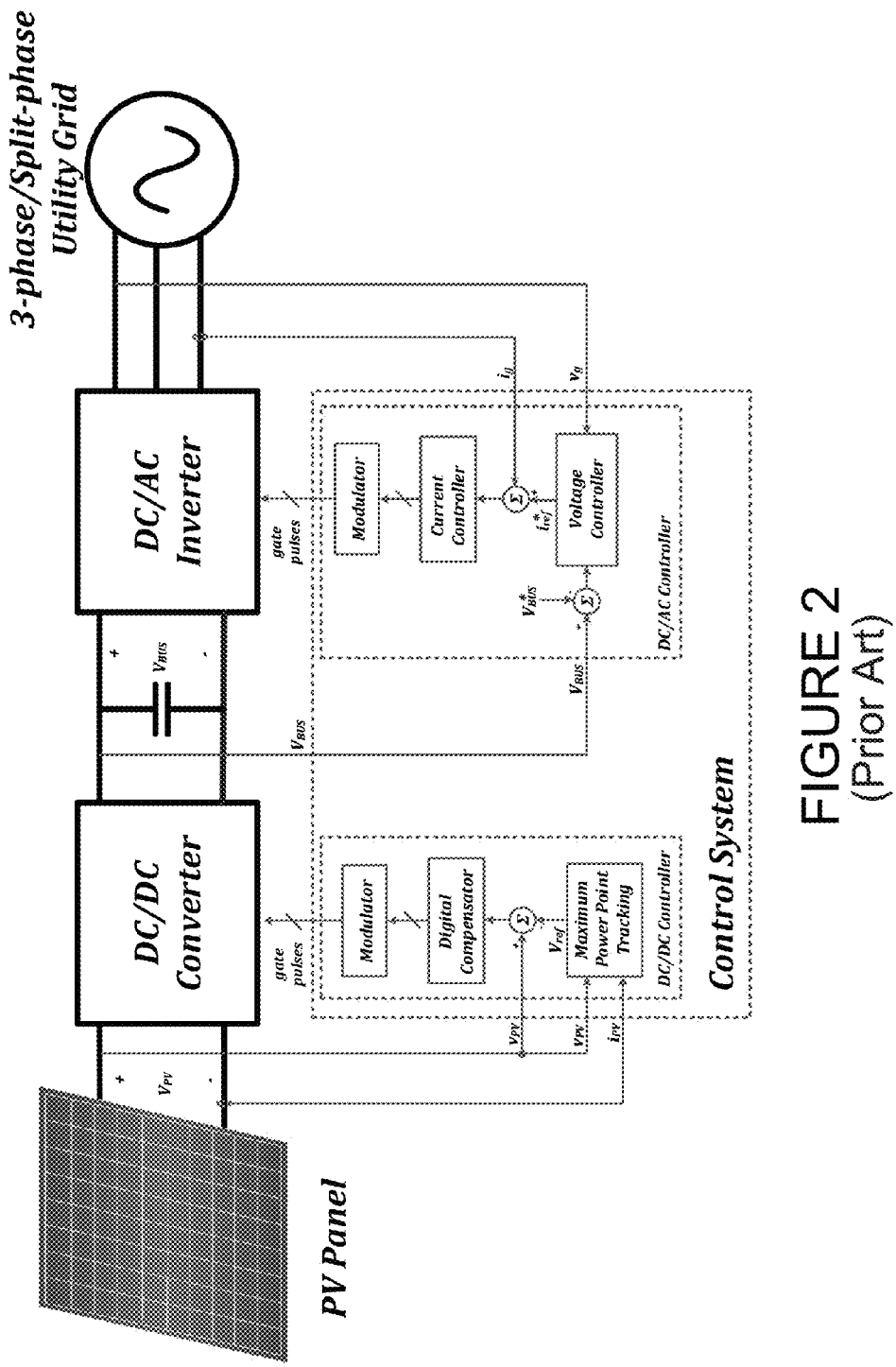
FIG. 2 is a block diagram of a control system for the conditioning system of FIG. 1 according to the prior art.
Figure 3:
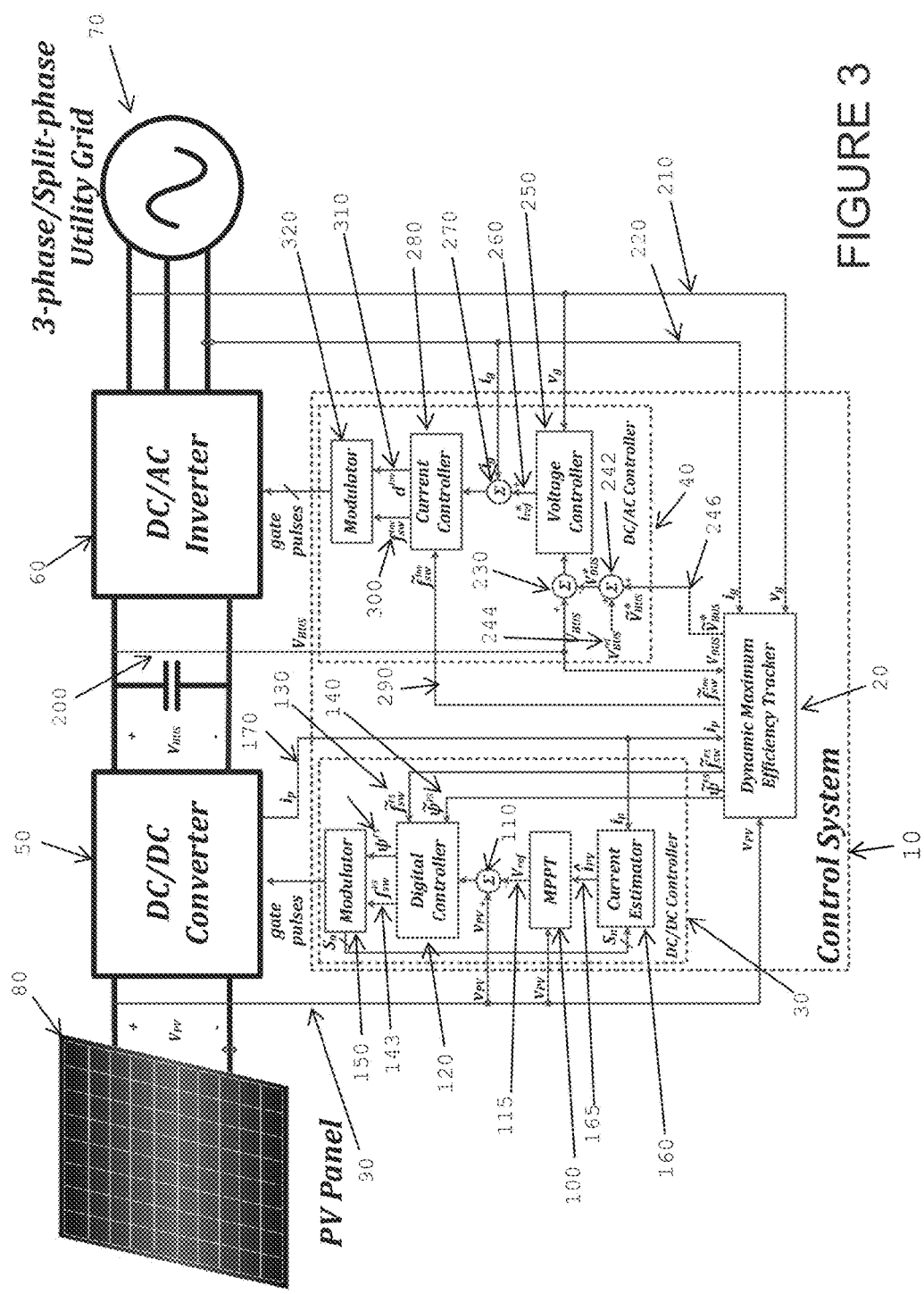
FIG. 3 is a block diagram of a control system for a power conditioning system according to one aspect of the present invention.

Referring to FIG. 3, a block diagram of a control system according to one aspect of the invention is illustrated. The control system 10 is equipped with a proposed Dynamic Maximum Efficiency Tracker (DMET) control block 20. In the system of FIG. 3, the DMET control block 20 measures the efficiency of the micro-inverter in a real-time manner. The DMET executes a search method which adjusts the control parameters such that the operating point of the micro-inverter as a whole reaches the maximum efficiency point. It should be noted that even though the block diagram shown in FIG. 3 is specifically for a micro-inverter, the concept can be applied to different power conditioning systems. As can be seen, the power conditioning module in FIG. 3 uses a DC/DC converter and a DC/AC inverter to condition power from a renewable energy source for use with a utility power grid. The example in FIG. 3 receives power from a photo-voltaic panel which converts solar energy into electrical power. Other renewable energy sources, such as wind power and tidal power sources, can also be used.

In FIG. 3, the control system 10 has a DMET control block 20 which receives input from a DC/DC controller block 30 and from a DC/AC controller block 40. The DC/DC controller block 30 provides gate pulses for the DC/DC converter circuit 50 while the DC/AC controller block 40 provides gate pulses for the DC/AC inverter circuit 60. As noted above, the DC/DC converter circuit 50 and the DC/AC inverter circuit 60 cooperate to provide a sinusoidal current into the utility grid 70 from the PV panel 80.

Referring to the DC/DC controller block 30, the controller block 30, along with the DMET control block 20, receives a PV voltage $v_{PV}$ 90 from the PV 80. This voltage 90 is received by a maximum power point tracking (MPPT) module 100 and a summation module 110. The summation module 110 takes the difference between a reference voltage $V_{ref}$ 115 from the module 100 and the voltage 90 and feeds the result into a digital controller 120. The digital controller 120 also receives adjustment values for two control inputs from the DMET control block 20. As will be explained below, these control inputs are the adjustment value 130 for the switching frequency and the adjustment value 140 for the duty cycle for the DC/DC converter circuit. Based on these adjustment values 130, 140, the digital controller 120 outputs the desired switching frequency 143 and the desired duty cycle 145 for the DC/DC converter circuit 50 to a modulator 150. The digital controller adjusts the switching frequency and the duty cycle by the given adjustment values to result in the desired switching frequency 143 and the desired duty cycle 145. The modulator 150 produces the required gate pulses for the DC/DC converter circuit based on the desired switching frequency and the desired duty cycle from the digital controller 120. The signals for the DC/DC converter circuit are also sent to a current estimator 160 within the DC/DC controller block 30. The current estimator 160 also receives a current reading $i_p$ 170 from the DC/DC converter circuit 50. The current estimator 160 then provides an estimated PV current $i_{PV}$ 165 to the MPPT module 100 based on the current reading 170. It should be noted that the DMET control block 20 also receives the current reading $i_p$ 170 from the DC/DC converter circuit 50 and this is used to determine the PV current or the input current to the DC/DC converter (i.e. $I_{PV}$).

Referring to the DC/AC controller block 40, the controller block 40 receives, as output from the DC/DC inverter circuit, a voltage $V_{BUS}$ 200, a grid voltage $v_g$ 210, and a grid current $i_g$ 220. All these outputs are also received by the DMET control block 20. The voltage $V_{BUS}$ 200 is received by a summation module 230 which takes the difference between the voltage 200 and a resulting reference voltage 240 from a summation module 242. The summation module 242 adds a fixed reference voltage 244 to an adjustment reference voltage 246 from the DMET control block 20. The result of summation module 230 is then fed to a voltage controller 250 within the DC/AC controller block 40. This voltage controller 250 also receives the grid voltage 210 from the grid 70. The voltage controller 250 outputs a current signal 260 which is subtracted from grid current 220 by summation module 270. The result is then sent to a current controller 280. The current controller 280 also receives an adjustment value 290 for the inverter switching frequency from the DMET block 20. Based on this adjustment value 290 for the switching frequency for the DC/AC inverter circuit, the current controller 280 outputs a switching frequency 300 and a duty cycle 310 to a modulator 320. The modulator 320 then produces suitable gate signals which are sent to the DC/AC inverter 60.

As can be seen from FIG. 3, the DMET control block 20 receives different signals in order to calculate the real-time efficiency of the micro-inverter. Based on the calculated efficiency, the control parameters of the system are perturbed to find the highest efficiency point. Since the measurements are performed in real-time, the method for seeking the highest efficiency point is not affected by changes in the parameters or by system uncertainties.

The efficiency of the micro-inverter depends on the combination of the efficiency of the DC/DC converter and the efficiency of the DC/AC inverter. There are multiple parameters that can be changed to improve the efficiency of the micro-inverter. However, the most effective parameters that can be dynamically changed to improve the efficiency are the switching frequency and duty-cycle (or phase-shift) of the DC/DC converter and the switching frequency and duty cycle of the DC/AC inverter as well as the DC-bus voltage. Therefore, the efficiency function can be defined as:

$$\eta(t) = \eta(f_{sw}^{FS}(t), \psi^{FS}(t), v^*_{BUS}(t), f_{sw}^{Inv}(t), d^{Inv}(t)) \qquad (1)$$

where $f_{sw}^{FS}$ is the switching frequency of the first-stage DC/DC converter, $\psi^{FS}$ is the phase-shift (i.e., duty cycle) of the first-stage DC/DC converter, $v^*_{BUS}$ is the reference value of the intermediate DC-bus voltage, $f_{sw}^{Inv}$ is the switching frequency of the inverter, and $d^{Inv}$ is the duty cycle of the inverter.

Figure 4:
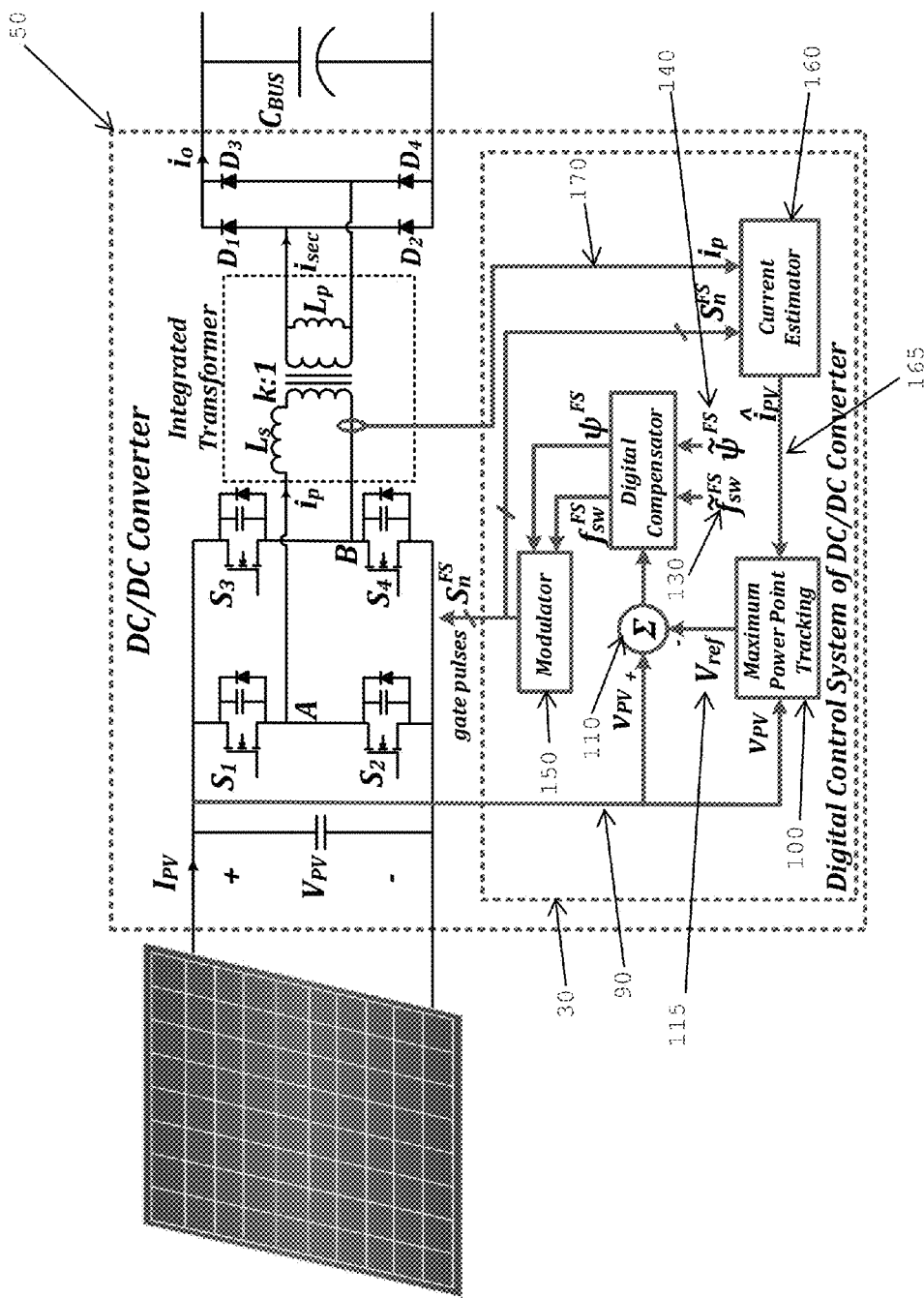
FIG. 4 is a block diagram of a DC/DC converter and a digital control system for controlling the converter.

FIG. 4 shows an exemplary arrangement for the first stage DC/DC converter. According to FIG. 4 a full-bridge current-driven power circuit is used for the first stage DC/DC converter. It should be noted that other topologies (e.g., resonant topologies) can also be used for the first stage DC/DC converter. FIG. 4 illustrates the block diagram of the DC/DC converter controller block 30 as well. According to the control diagram, there are two main parameters used to control the DC/DC converter: the phase-shift between the two legs of the full-bridge, namely $\psi^{FS}$ 145, and the switching frequency of the power semiconductors, namely $f_{sw}^{FS}$ 143. The main task of the control system is to perform maximum power point tracking. Since there are two control variables, namely $\psi^{FS}$ and $f_{sw}^{FS}$, the dynamic maximum efficiency tracking (DMET) and maximum power point tracking (MPPT) can be performed simultaneously. Either of the control variables $\psi^{FS}$ and $f_{sw}^{FS}$ or a combination of the two can be used to perform DMET. For instance, the switching frequency 143 of the DC/DC converter circuit can be selected to perform DMET. At the same time, the phase shift 145 can be used to perform maximum power point tracking. The method used to perform maximum efficiency tracking is illustrated in the flow chart of FIG. 5.

Figure 5:
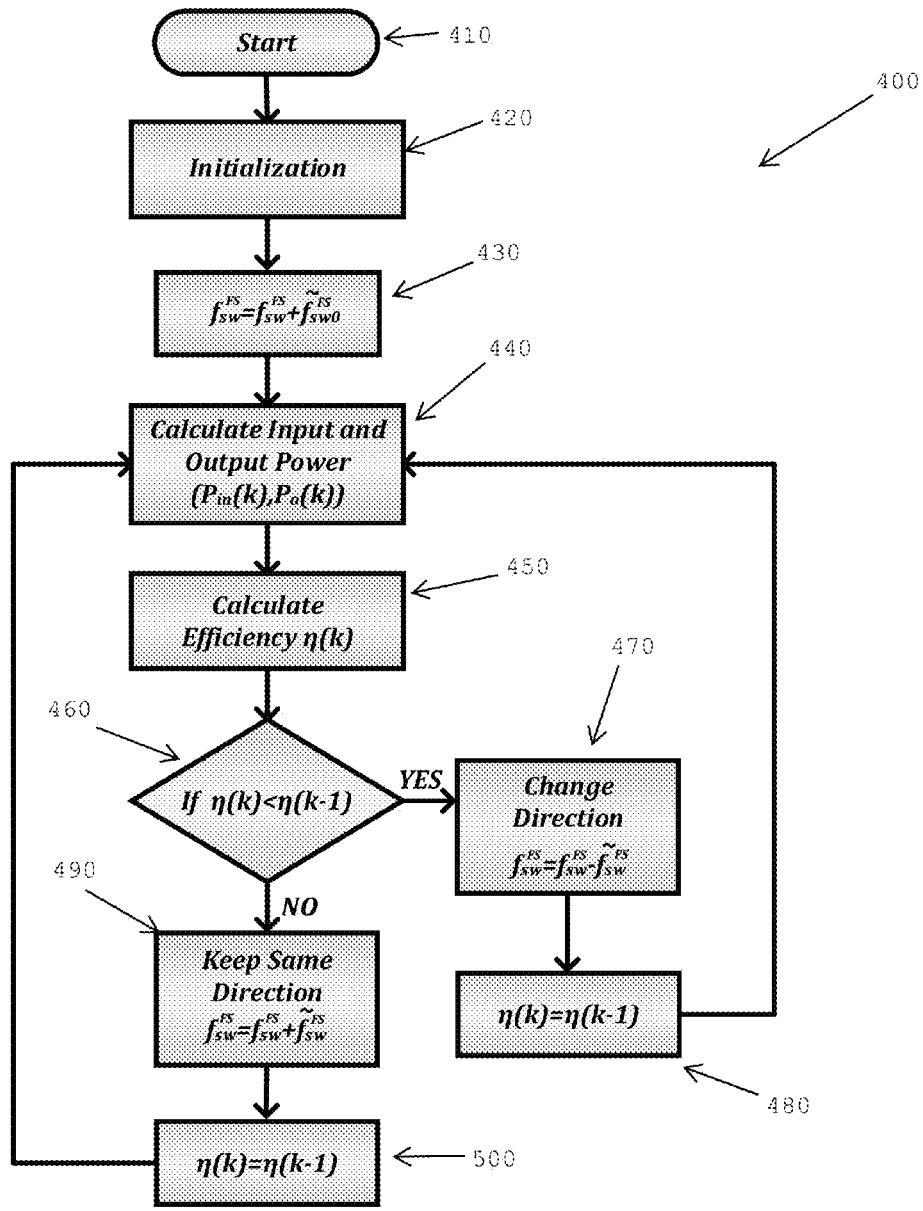
FIG. 5 is a flowchart detailing the steps in a method according to another aspect of the present invention.

FIG. 5 is an exemplary search algorithm to find the optimal operating point at which the DC/DC converter has the maximum efficiency. According to FIG. 5, the search algorithm slightly changes the switching frequency of the DC/DC converter to determine the impact on the efficiency of the system. If the efficiency increases, the frequency change continues in the same direction, otherwise the direction of the frequency change will be reversed. The step of the frequency change can be calculated based on the Gradient Descent (GD) method, which steers the system through the steepest gradient of the efficiency curve:

$$\tilde{f}_{sw}^{FS} = -\gamma \Delta \eta(k) \qquad (2)$$

where $\Delta \eta(k) = \eta(k+1) - \eta(k)$.

It should be clear that other extremum seeking techniques other than the Gradient Descent method can also be used to reach to the maximum efficiency point. It should be clear that that the control system has two control variables (e.g., switching frequency and phase-shift or duty cycle) in order to perform two tasks, namely maximum power point tracking and maximum efficiency point tracking. One control variable can thus be used to perform one task (e.g. maximum power point tracking) while the other control variable is used to perform the other task (e.g. maximum efficiency point tracking).

It should be clear that the system does not directly calculate efficiency using the efficiency function. Instead, the system calculates efficiency based on the measured input and the measured output of the micro-inverter circuit. Using these measured state variables, the efficiency of the circuit can be determined. As can be seen from FIG. 3, the input voltage to the converter, $V_{PV}$ 90 is measured. The output voltage is also measured as $V_g$ 210. The input current is also estimated as $i_{PV}$ from the current 170. The output current is measured as $i_g$ 220. By using these measured values, the power efficiency of the system as a whole can be calculated as output power divided by input power. Thus, the real-time efficiency for a single-phase micro-inverter is equal to $$\eta = \frac{P_o}{P_{in}} = \frac{V_o^{rms} \cdot I_o^{rms} \cdot \cos\theta}{V_{in} \cdot I_{in}} \qquad (3)$$

where $V_o^{rms} = V_g^{rms}$ is the Root-Mean-Square (RMS) value of the grid voltage (i.e. the output voltage), $I_o^{rms} = I_g^{rms}$ is the RMS value of the grid current (i.e. the output current), $\theta$ is the phase angle between the grid voltage and the grid current, $V_{in} = V_{PV}$ is the input voltage of the converter (i.e. the PV voltage), and $I_{in} = I_{PV}$ is the input current of the converter (i.e. the PV current).

Using this relationship, the efficiency of the system can be found and, accordingly, the maximum efficiency point can be found by judiciously perturbing the control inputs. It should be noted that, for a three-phase system, the efficiency is given by:

$$\eta = \frac{P_o}{P_{in}} = \frac{\sqrt{3} \, V_o^{rms} \cdot I_o^{rms} \cdot \cos\theta}{V_{in} \cdot I_{in}} \qquad (4)$$

It should be noted that while the above calculates micro-inverter efficiency based on measured input and output state variables from the PV and from the grid, micro-inverter efficiency can also be determined as a combination of the efficiencies of the converter and of the inverter. As such, the input and output state variables for both the converter and the inverter can be measured independently and, based on these measurements, the separate efficiencies of the converter and of the inverter can be found. These separate efficiencies can then be used to determine the overall efficiency of the micro-inverter as a whole.

Referring to FIG. 5, the method for finding the maximum efficiency of the micro-inverter is illustrated in the flowchart. The method begins at step 400. In step 410, the system is initialized with suitable beginning or initial values. In step 430, the switching frequency for the DC/DC converter 50 is set to the current value plus an adjustment value $\hat{f}_{sw}^{FS}$. Step 440 then determines the input and the output power of the micro-inverter. As noted above, the input and output power for the micro-inverter can be calculated based on the measured input and output currents and voltages to the micro-inverter. Once the input and output power of the micro-inverter has been calculated, the efficiency of the micro-inverter can thus be calculated (step 450). Decision 460 then determines whether efficiency has increased or decreased by comparing the current efficiency calculation (i.e. based on reading k) with the immediately preceding efficiency calculation (i.e. based on reading k−1). If the efficiency has decreased, then the direction of the perturbation has to change. The switching frequency is thus defined to be the current frequency less a predetermined adjustment value (step 470). Step 480 then saves the current efficiency calculation to be the next immediately preceding efficiency calculation. The logic flow then loops back to step 440.

In the event the decision 460 indicates that the current efficiency is greater than the immediately preceding efficiency calculation, then step 490 shows that the direction of the perturbation is kept. Thus, the next step is to assign the next switching frequency value to be the current frequency value plus the adjustment value (step 490). Step 500 then saves the current efficiency calculation result to be the next immediately preceding calculation result. The logic flow then loops back to step 440.

While the explanation above for FIG. 5 relates to determining the efficiency of the micro-inverter and finding the maximum efficiency point using the switching frequency for the converter, the method can also be used using any of the other control inputs available. As such, the switching frequency for the inverter, the phase shift for either the converter or the inverter, and the duty cycle for the inverter may be substituted for the converter's switching frequency in the method. Similarly, the method may also be used to determine the efficiency of the converter or to determine the efficiency of the inverter. Of course, to determine the efficiency of only part or of only a portion of the micro-inverter circuit (i.e. only the efficiency of the converter part of the micro-inverter or only the efficiency of the inverter part of the micro-inverter), only the inputs and outputs to that part or portion of the micro-inverter are used in the calculations.

From FIG. 5 and FIGS. 3 and 4, it should be clear that the output of the DMET control block 20 sent to the DC/DC converter controller block 30 are adjustment values for the phase shift and the switching frequency of the power semiconductors. These adjustment values are added or subtracted from the current values of the phase shift and the switching frequency to thereby perturb these parameters (see FIG. 5, steps 490 and 470). The effect of this perturbation is then measured and a new efficiency measurement is calculated from the resulting readings. It should also be clear that, in the example provided by FIG. 5, only the switching frequency is perturbed to find the maximum efficiency point for the micro-inverter circuit. If the switching frequency is used to find the maximum efficiency point, then the phase shift can be used for maximum power point tracking for the converter circuit. Similarly, if the phase shift is used to find the maximum efficiency point of the micro-inverter, the switching frequency can be used for maximum power point tracking for the converter circuitry. Conversely, if both phase shift and switching frequency are used to find the maximum efficiency operating point for the micro-inverter, both these parameters can be perturbed simultaneously or these parameters can be perturbed in turn to determine the effect on efficiency of such perturbations.

It should be clear that varying combinations of control inputs can be used to determine the maximum efficiency point for the micro-inverter. The control inputs can be a combination of control inputs to the converter or to the inverter. However, these inputs can also be used to perform necessary control tasks for the different portions of the micro-inverter. As an example, since the converter may require MPPT (maximum power point tracking), one of the two available control inputs (i.e. either the switching frequency or the phase shift) may be used for MPPT. The other control input can be used for the control task. Similarly, in combination with a control input for the converter, one or more control inputs to the inverter may also be used for DMET. Thus, as an example, the switching frequency for the converter may be used in combination with the switching frequency for the inverter to find the maximum efficiency point for the micro-inverter as a whole. As can be imagined, other control input combinations may be used.

Figure 6:
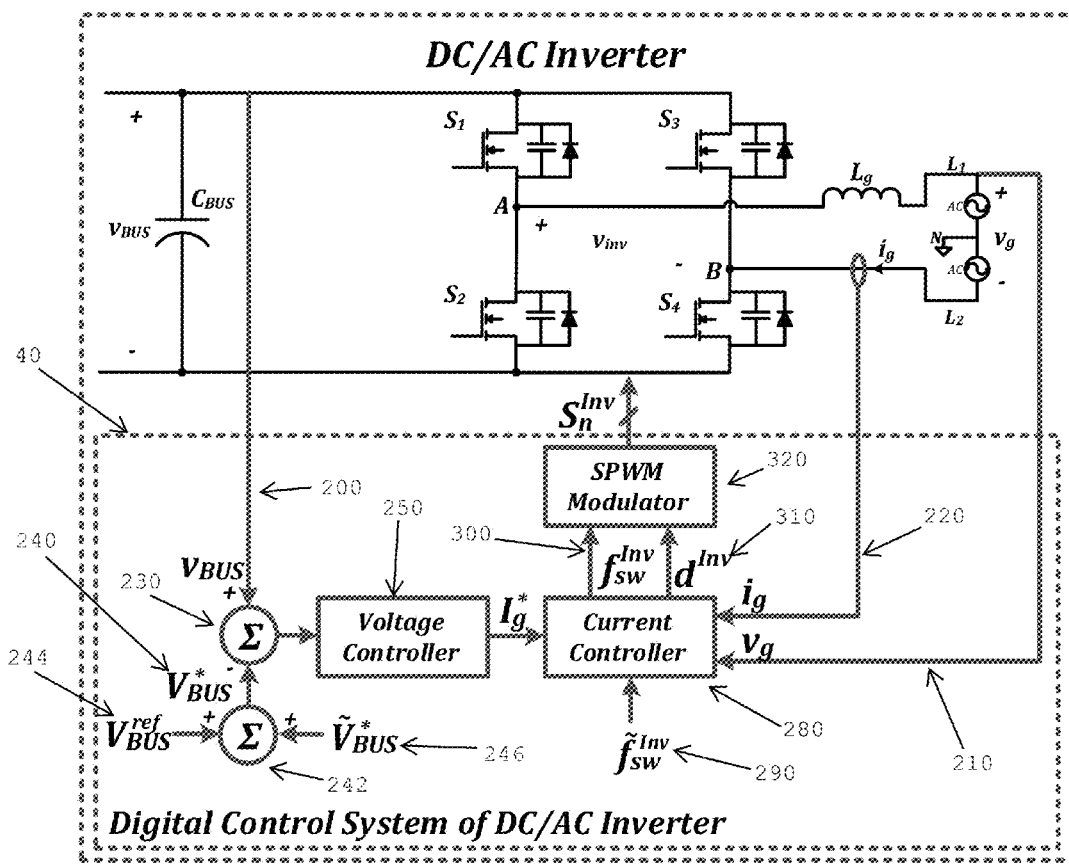
FIG. 6 is a block diagram of a DC/AC single-phase inverter and its control system.

FIG. 6 shows an exemplary arrangement for the second stage DC/AC inverter. As can be seen from FIG. 6, a typical full-bridge inverter 510 as well as an output filter 520 is used to implement the DC/AC inverter. The control loops for the DC/AC inverter are also illustrated in FIG. 6. Control of the inverter is accomplished using two cascaded control loops: an external voltage loop and an internal current loop. The voltage loop is responsible for regulating the DC-bus voltage and the internal current loop is responsible for shaping the output current of the inverter into a nearly sinusoidal waveform. The output of the voltage controller 250 determines the amplitude of the reference current for the current loop and the current controller 280 determines the duty ratio of the gate pulses for the inverter circuit. Usually, the reference value for the DC-bus voltage is fixed and the current loop only uses the duty cycle to shape the output current while the switching frequency is constant. However, in the present invention, the DC-bus voltage and the switching frequency are employed to determine the maximum efficiency for the micro-inverter. Because of this, there are three control inputs to the inverter control system, namely the duty cycle, $d^{Inv}$, the switching frequency, $f_{sw}^{Inv}$, and the reference value for the DC-bus voltage, $v^*_{BUS}$. By using the control inputs, different control tasks (e.g., regulating the DC-bus voltage and injecting a nearly sinusoidal current to the grid) as well as the maximum efficiency tracking can be performed. In order to implement the DMET method, the reference value for the DC-bus voltage, $v^*_{BUS}$, and the switching frequency, $f_{sw}^{Inv}$ are used. Thus, the search method described above with reference to FIG. 5 changes or perturbs these parameters to search for the highest efficiency point.

Figure 7:
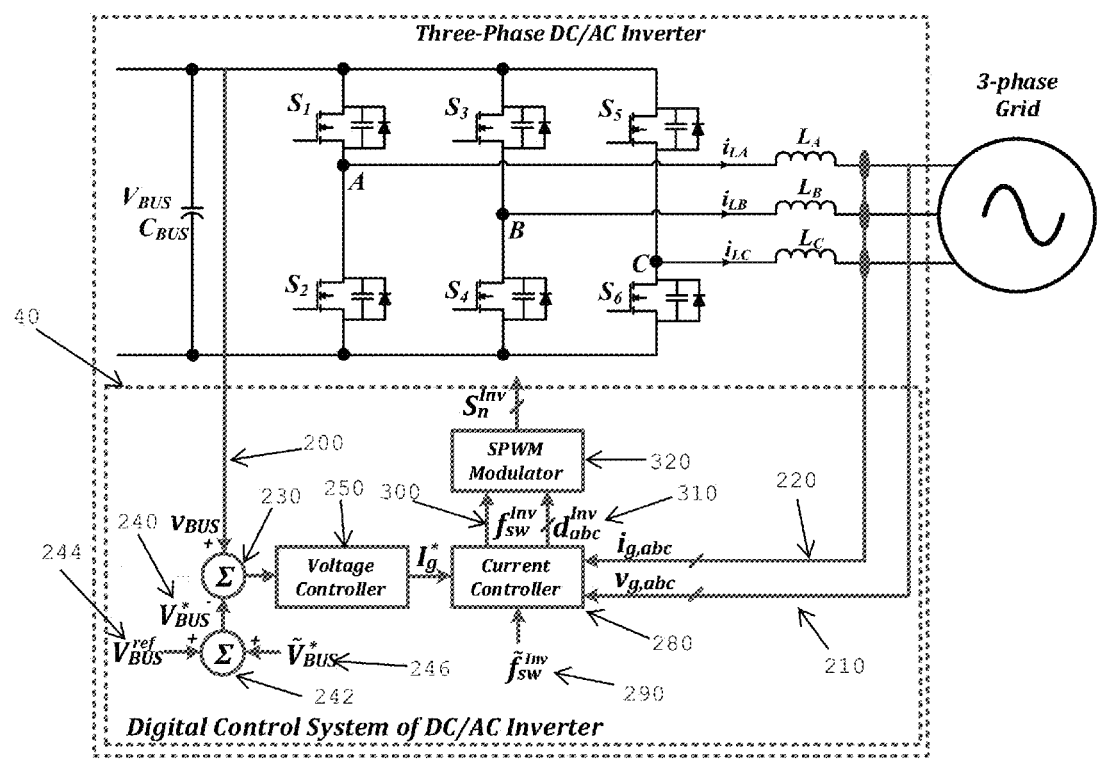
FIG. 7 is a block diagram of a DC/AC three-phase inverter and its control system.

It should be noted that, in FIGS. 6 and 7, an adjustment value $\hat{v}^*_{BUS}$ 246 for the reference DC-bus voltage is output by the DMET control block 20. This adjustment value is added to a fixed reference bus voltage 244 by a summation module 242. The resulting reference DC-bus voltage $V^*_{BUS}$ 240 is added to the measured DC-bus intermediate voltage $V_{BUS}$ 200 by summation module 230. The result is then used by the voltage controller 250. For clarity, it should also be noted that, in the example given, the duty cycle $d^{Inv}$ 310 is used by the current controller 280 for control tasks related to the inverter. For this example, the duty cycle 310 is not used by the DMET control block 20 and this duty cycle is determined by the current controller independent of the DMET control block 20. However, as noted above, this duty cycle may be used by the DMET control block 20 for finding the maximum efficiency point for the micro-inverter as long as some other control input is used for whatever necessary control tasks there may be for the inverter. As noted above, such control tasks may include the regulation of the DC-bus voltage and the shaping of the output current.

While the diagram in FIG. 6 is for a single-phase inverter, the concepts explained above and implemented in FIG. 6 can be applied to a three-phase inverter with some slight variations. FIG. 7 shows such a three-phase DC/AC inverter which uses an embedded DMET control block.

It should be noted that the method outlined and explained with reference to FIG. 5 is also applicable to the DC/AC inverter circuits in FIGS. 6 and 7. The overall efficiency of the micro-inverter (or of the power conditioning module which includes the micro-inverter) can be determined using the measured input power and output power of the micro-inverter as a whole. The control inputs to the inverter can be perturbed to find the maximum efficiency point for the micro-inverter. Similarly, the efficiency for the inverter (as opposed to the overall efficiency for the micro-inverter as a whole) can also be found. For the inverter efficiency, the input voltage to the inverter ($V_{BUS}$) is measured and the input current to the inverter circuit is the output current of the DC/DC converter circuit. The output voltage and output current of the inverter is measured as the grid current ($i_g$) 220 and the grid voltage ($v_g$) 210. With these values, the efficiency of the inverter portion of the micro-inverter can thus be calculated in terms of the inverter's input power and output power. Using the reference bus voltage 240 from the DMET control block 20 and the switching frequency for the semiconductors in the inverter circuit as the adjustable control inputs to the inverter controller block 40, the efficiency of the inverter can be tweaked until a maximum efficiency point for the inverter has been found.

Figure 8:
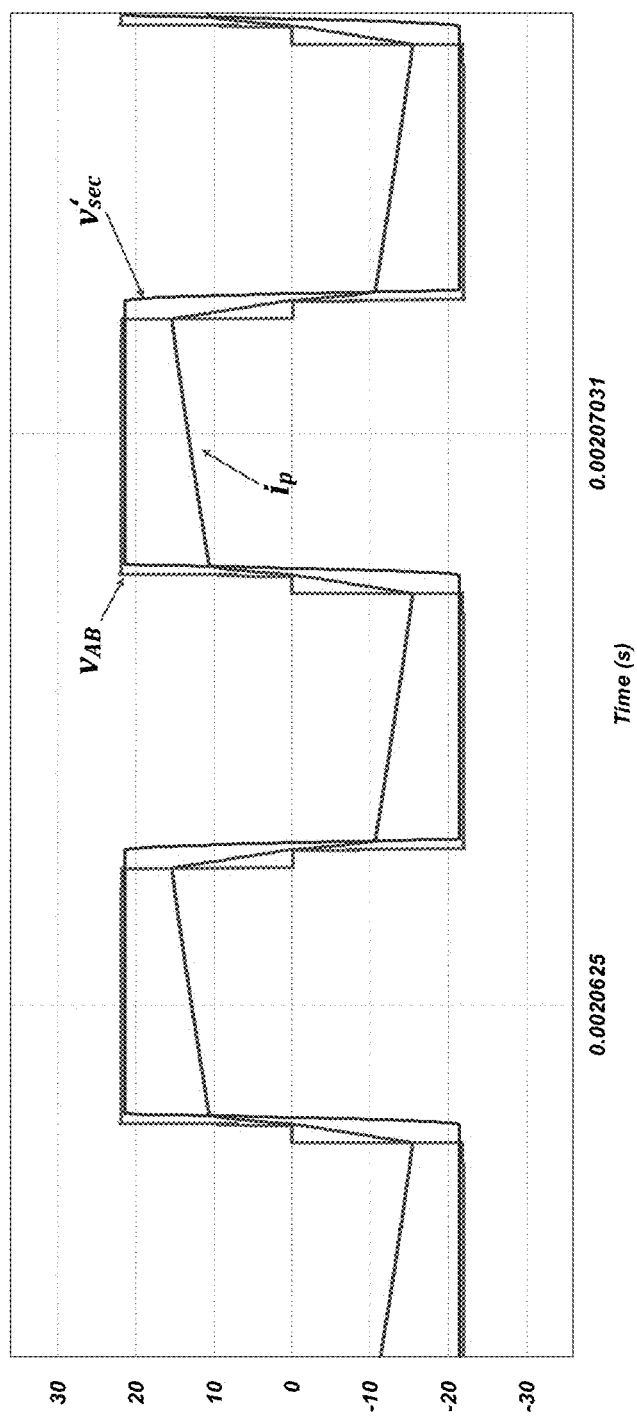
FIG. 8 illustrate simulation results for the DC/DC converter illustrated in FIG. 4.
Figure 9:
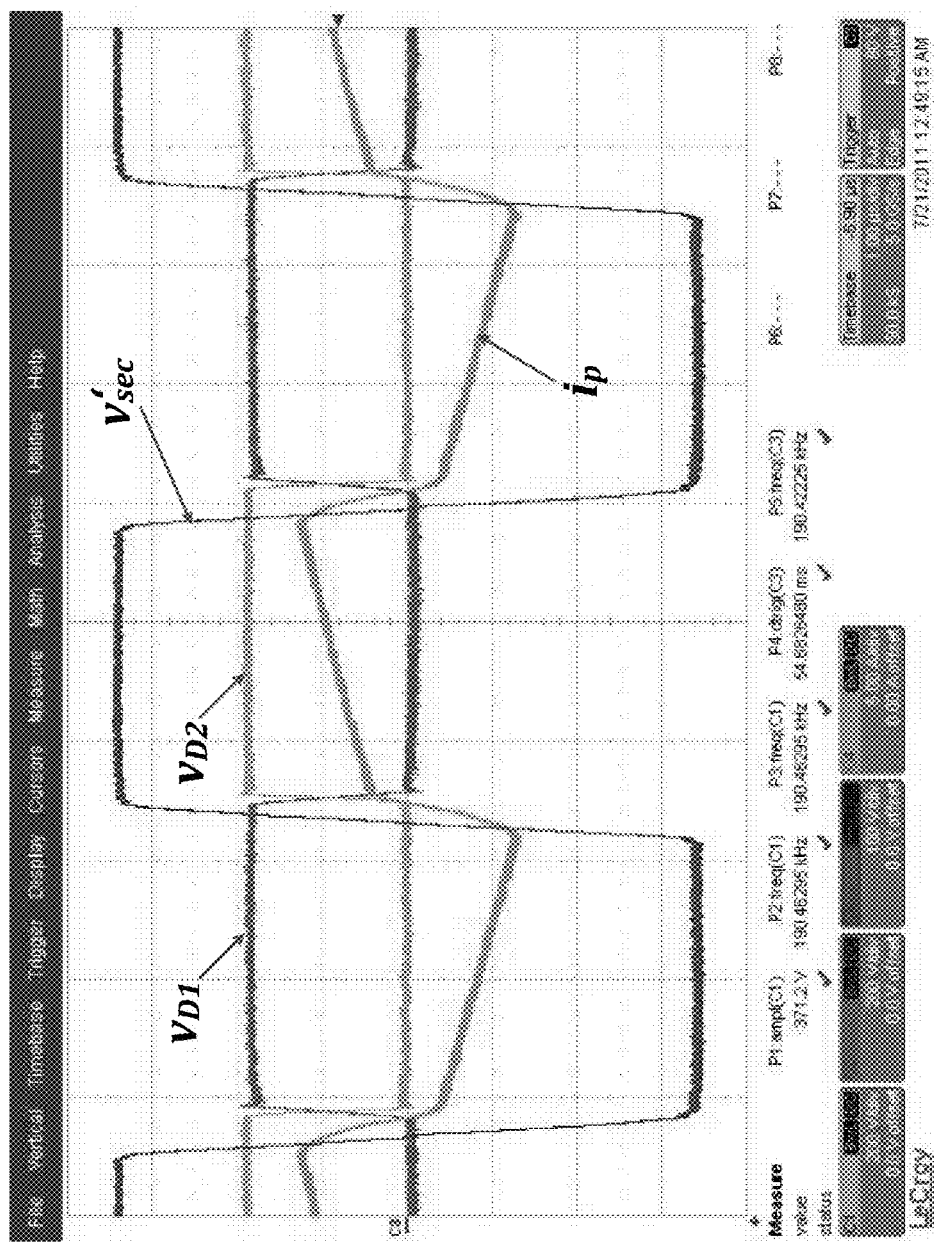
FIG. 9 illustrate experimental results for the DC/DC converter in FIG. 4.
Figure 10:
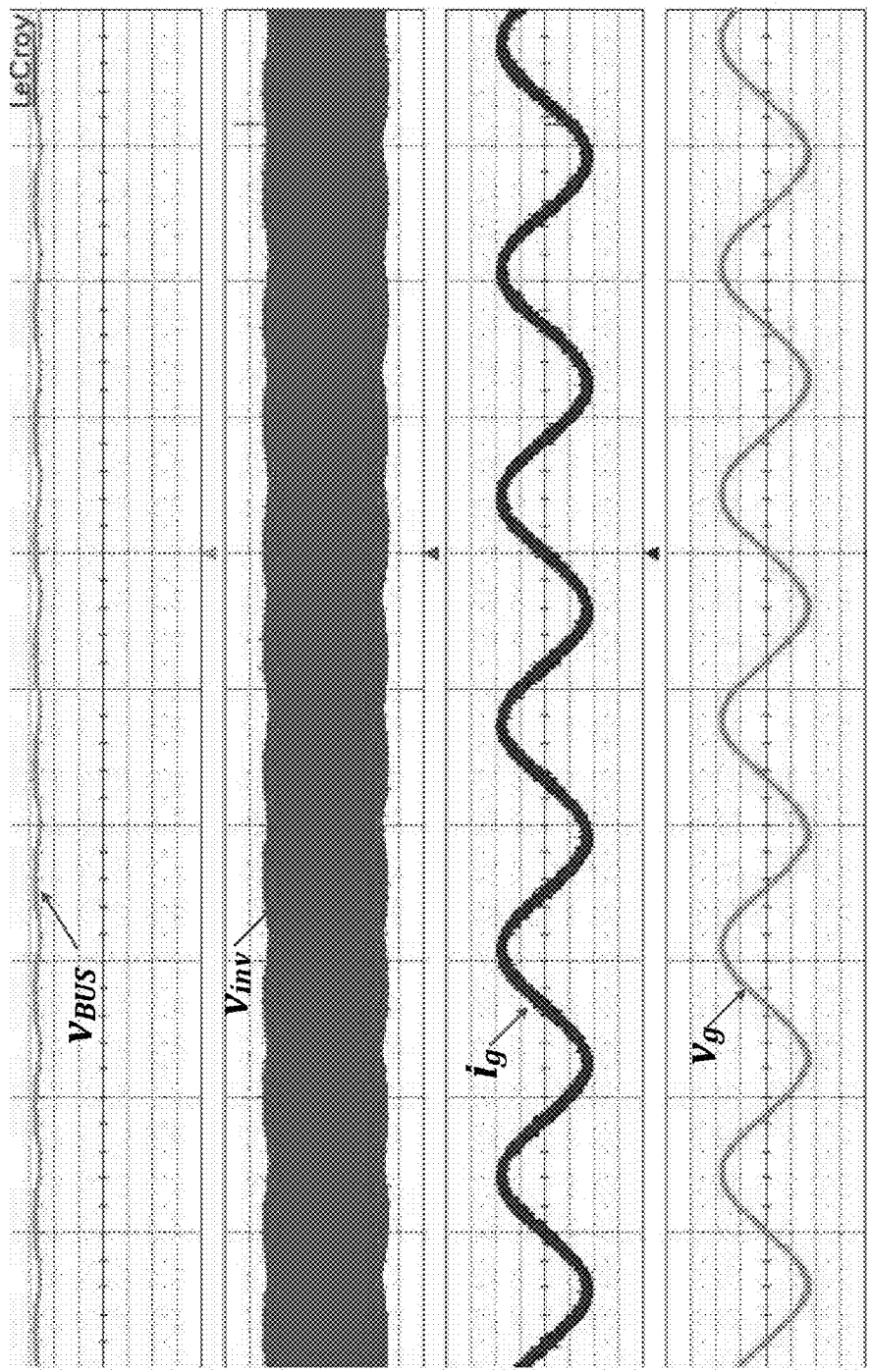
FIG. 10 show experimental results for the DC/AC inverter illustrated in FIG. 6.

In terms of performance of the above described circuits and methods, FIG. 8 shows the simulation waveforms for the DC/DC converter circuit. FIG. 8 shows the full-bridge output voltage, the transformer primary side current and the transformer secondary voltage reflected to the primary side. FIG. 9 shows the experimental results of the DC/DC converter. Also, FIG. 10 shows the experimental waveforms of the DC/AC inverter.

Figure 11:
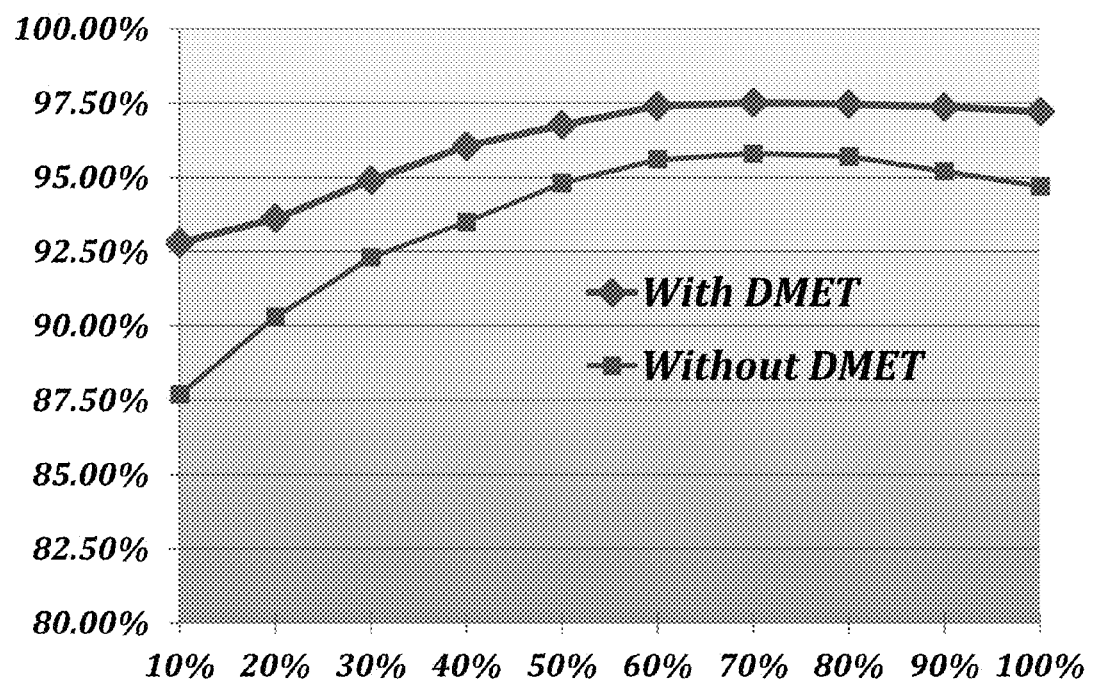
FIG. 11 detail a comparison between the efficiency of a power conditioning system using aspects of the present invention and a power conditioning system which does not use the present invention.

FIG. 11 shows the efficiency of the micro-inverter both with and without the DMET method and control block. As can be seen from FIG. 11, the DMET method and control block effectively increases the efficiency of the micro-inverter under different operating conditions.

It should be noted that the DMET control block can be implemented as a general data processor in conjunction with a number of A/D converter modules and, optionally, D/A converter modules. The A/D converter modules would receive the outputs from the micro-inverter system and convert the analog signals into digital values for processing by the general data processor. The D/A converter modules, if necessary, would receive digital values from the general data processor and convert these into analog signals for use by the controller blocks.

The embodiments of the invention may be executed by a computer processor or similar device programmed in the manner of method steps, or may be executed by an electronic system which is provided with means for executing these steps. Similarly, an electronic memory means such as computer diskettes, CD-ROMs, Random Access Memory (RAM), Read Only Memory (ROM) or similar computer software storage media known in the art, may be programmed to execute such method steps. As well, electronic signals representing these method steps may also be transmitted via a communication network.

Embodiments of the invention may be implemented in any conventional computer programming language. For example, preferred embodiments may be implemented in a procedural programming language (e.g. "C") or an object-oriented language (e.g. "C++", "java", "PHP", "PYTHON" or "C#"). Alternative embodiments of the invention may be implemented as pre-programmed hardware elements, other related components, or as a combination of hardware and software components.

Embodiments can be implemented as a computer program product for use with a computer system. Such implementations may include a series of computer instructions fixed either on a tangible medium, such as a computer readable medium (e.g., a diskette, CD-ROM, ROM, or fixed disk) or transmittable to a computer system, via a modem or other interface device, such as a communications adapter connected to a network over a medium. The medium may be either a tangible medium (e.g., optical or electrical communications lines) or a medium implemented with wireless techniques (e.g., microwave, infrared or other transmission techniques). The series of computer instructions embodies all or part of the functionality previously described herein. Those skilled in the art should appreciate that such computer instructions can be written in a number of programming languages for use with many computer architectures or operating systems. Furthermore, such instructions may be stored in any memory device, such as semiconductor, magnetic, optical or other memory devices, and may be transmitted using any communications technology, such as optical, infrared, microwave, or other transmission technologies. It is expected that such a computer program product may be distributed as a removable medium with accompanying printed or electronic documentation (e.g., shrink-wrapped software), preloaded with a computer system (e.g., on system ROM or fixed disk), or distributed from a server over a network (e.g., the Internet or World Wide Web). Of course, some embodiments of the invention may be implemented as a combination of both software (e.g., a computer program product) and hardware. Still other embodiments of the invention may be implemented as entirely hardware, or entirely software (e.g., a computer program product).

A person understanding this invention may now conceive of alternative structures and embodiments or variations of the above all of which are intended to fall within the scope of the invention as defined in the claims that follow.

We claim:

1. A method for optimizing an operating point of a circuit, the method comprising:
 a) receiving input state variables for at least part of said circuit;
 b) receiving output state variables for at least part of said circuit;
 c) determining an efficiency of said at least part of said circuit based on said input state variables and output state variables;
 d) perturbing at least one control input to said at least part of said circuit to result in a perturbation of said at least one control input;
 e) determining an effect on said efficiency by perturbation;

f) adjusting a direction of said perturbation based on said effect;

g) repeating d) to f) until a maximum efficiency for said at least part of said circuit is achieved, wherein said circuit is a micro-inverter circuit; and wherein said at least one control input is a reference voltage for an intermediate DC-bus voltage.

2. The method according to claim 1, wherein said at least one part of said micro-inverter circuit is at least one of:

a DC/DC converter circuit; and a DC/AC inverter circuit.

3. The method according to claim 1, wherein step c) comprises determining an efficiency of all of said micro-inverter circuit.

4. The method according to claim 2, wherein step c) comprises separately determining an efficiency of said converter circuit and an efficiency of said inverter circuit.

5. The method according to claim 1, wherein said at least one control input is at least one of:

a switching frequency of semiconductors in said converter circuit;

a phase shift of said converter circuit;

a switching frequency of semiconductors in said inverter circuit; and a reference voltage for an intermediate DC-bus voltage.

6. The method according to claim 1, wherein said input state variables include an input voltage and an input current to said at least part of said micro-inverter.

7. The method according to claim 1, wherein said output state variables include an output voltage and an output current to said at least part of said micro-inverter.

* * * * *